United States Patent

Beinglass et al.

[11] Patent Number: 5,932,286
[45] Date of Patent: Aug. 3, 1999

[54] DEPOSITION OF SILICON NITRIDE THIN FILMS

[75] Inventors: Israel Beinglass, Sunnyvale; Mahalingam Venkatesan, San Jose, both of Calif.

[73] Assignee: Applied Materials, Inc., Santa Clara, Calif.

[21] Appl. No.: 08/033,656

[22] Filed: Mar. 16, 1993

[51] Int. Cl.$^6$ .................................................. C23C 16/34

[52] U.S. Cl. ................................ 427/255.18; 427/255.11; 427/255.394

[58] Field of Search .............................. 427/255.1, 255.2, 427/255

[56] References Cited

U.S. PATENT DOCUMENTS

| | | | |
|---|---|---|---|
| 4,395,438 | 7/1983 | Chiang | 427/255.1 |
| 4,699,825 | 10/1987 | Sakai et al. | 427/255.2 |
| 4,894,352 | 1/1990 | Lane et al. | 427/578 |
| 4,951,601 | 8/1990 | Maydan et al. | |
| 5,085,887 | 2/1992 | Adams et al. | |

*Primary Examiner*—Diana Dudash
*Assistant Examiner*—Bret B. Chen
*Attorney, Agent, or Firm*—Birgit E. Morris

[57] ABSTRACT

Thin, uniform films of silicon nitride can be deposited onto a single substrate in a low pressure chemical vapor deposition process at a practicable rate from a gas mixture including a silane precursor gas and ammonia by maintaining the pressure at between about 5 and about 100 Torr. Deposition rates of up to about 185 angstroms per minute are readily achieved.

7 Claims, 2 Drawing Sheets

DEPOSITION OF SILICON NITRIDE THIN FILMS

This invention relates to the deposition of silicon nitride using a low pressure chemical vapor deposition process. More particularly, this invention relates to the deposition of thin layers of silicon nitride in a single substrate deposition chamber.

BACKGROUND OF THE INVENTION

Low pressure chemical vapor deposition (LPCVD) processes for the deposition of silicon nitride layers are well known. However, such films have been processed only in batch-type processing chambers that can process up to about 100 substrates (silicon wafers) per batch at fairly low pressures of about 300 millitorr. The deposition rate is quite low, e.g., about 30–40 angstroms per minute, but economies of scale are achieved by processing a plurality of substrates at one time.

However, as semiconductor substrates have become larger, up to 6–8 inches in diameter, and the number of devices formed in a substrate has increased, substrate processing is increasingly being performed in single substrate chambers. Single substrate processing can be performed in much smaller processing chambers, and the processes can be better controlled. Further, vacuum processing systems have been developed to carry out more than one processing step on a single substrate without removing the substrate from a vacuum environment. The use of such systems results in a reduced number of particulates that contaminate the surface of substrates during processing, thereby improving device yield. Such vacuum systems include a central robotic transfer chamber connected to various processing chambers, such as the Applied Materials 5000 series processing system described in U.S. Pat. No. 4,951,601 to Maydan et al.

A LPCVD chamber useful herein will be described with reference to FIG. 1. A single substrate reactor 31 has a top wall 32, side walls 33 and a bottom wall 34 that define the reactor 31 into which a single substrate 35, such as a silicon wafer, can be loaded. The substrate 35 is mounted on a pedestal or susceptor 36 that is rotated by a motor 37 to provide a time averaged environment for the substrate 35 that is cylindrically symmetric. A preheat ring 40 is supported in the chamber 30 and surrounds the wafer 35. The wafer 35 and the preheat ring 40 are heated by light from a plurality of high intensity lamps 38 and 39 mounted outside of the reactor 31. The top wall 32 and the bottom wall 34 of the chamber 30 are substantially transparent to light to enable the light from the external lamps 38 and 39 to enter the reactor 31 and heat the susceptor 36, the substrate 35 and the preheat ring 40. Quartz is a useful material for the top wall 32 and the bottom wall 34 because it is transparent to light of visible and IR frequencies; it is a relatively high strength material that can support a large pressure difference across these walls; and because it has a low rate of outgassing.

During deposition, the reactant gas stream flows from a gas input port 310, across the preheat ring 40 where the gases are heated, across the surface of the substrate 35 in the direction of the arrows 41 to deposit the desired films thereon, and into an exhaust port 311. The gas input port 310 is connected to a gas manifold (not shown) that provides one or a mixture of gases to enter the reactor 31 via a plurality of pipes into this port. The locations of the input ends of these pipes, the gas concentrations and/or flow rates through each of these pipes are selected to produce reactant gas flows and concentration profiles that optimize processing uniformity. Although the rotation of the substrate and thermal gradients caused by the heat from the lamps 38 and 39 can significantly affect the flow profile of the gases in the reactor 31, the dominant shape of the flow profile is a laminar flow from the gas input port 310 and across the preheat ring 40 and the substrate 35 to the exhaust port 311.

It would be desirable to be able to deposit uniform, thin films of silicon nitride on semiconductor substrates in a single substrate processing chamber at a practicable deposition rate.

SUMMARY OF THE INVENTION

We have found that thin, highly uniform films of stoichiometric silicon nitride can be deposited by chemical vapor deposition in a single substrate chamber at practicable rates by maintaining a relatively high pressure during the deposition. The films are highly uniform in composition and thickness, which was highly unexpected.

DETAILED DESCRIPTION OF THE INVENTION

Figure 1:
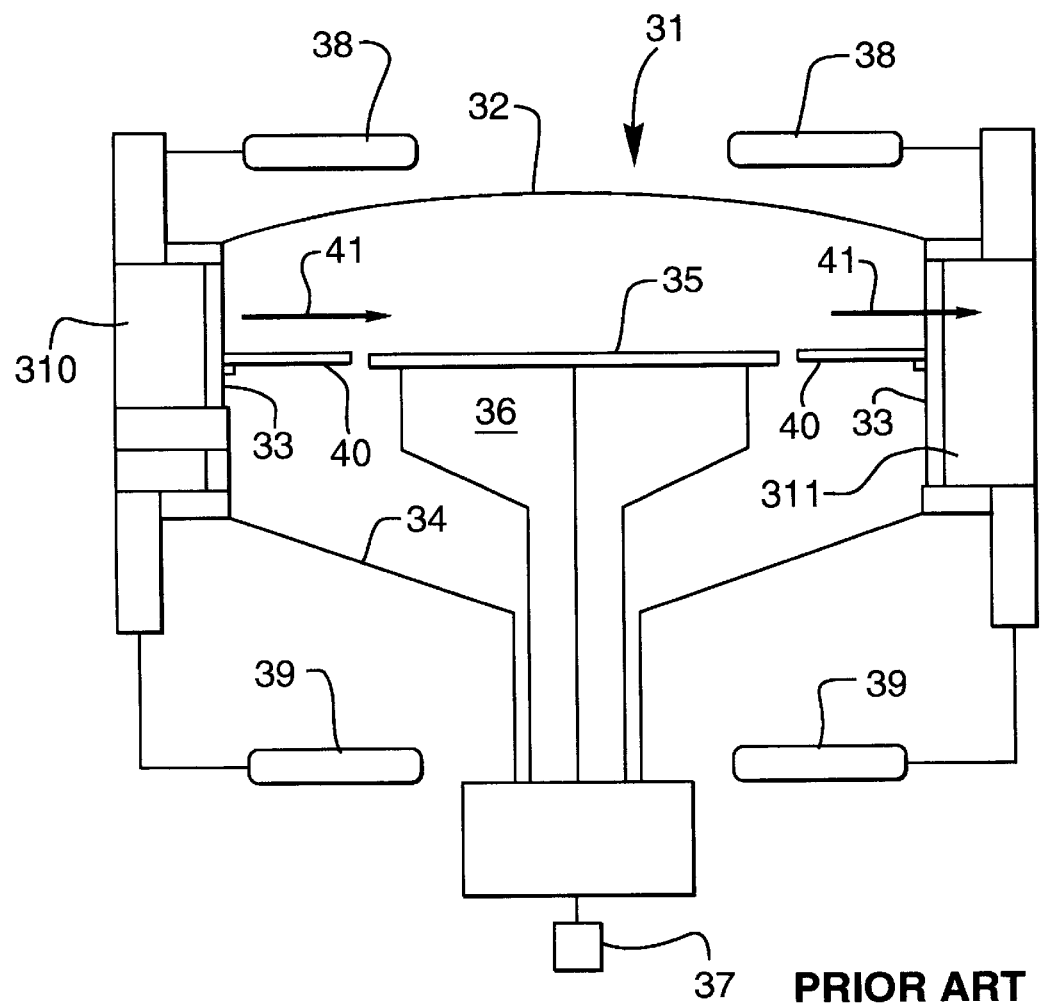
FIG. 1 is a cross sectional partially schematic view of a single substrate deposition chamber useful for depositing thin silicon nitride films.

Silicon nitride can be deposited onto a semiconductor substrate in a single substrate chamber as described above with respect to FIG. 1. A pressure of from about 5 to 100 Torr is employed to obtain the desired silicon nitride deposition rate and uniformity. The gases employed to form stoichiometric silicon nitride films include a silane, including silane, disilane and dichlorosilane; ammonia; and optionally a carrier gas, which can include gases such as hydrogen, nitrogen, argon and helium. By varying the conditions of pressure and temperature, the rate of deposition can be varied to obtain a practicable rate of deposition for the thickness of the deposited silicon nitride film desired.

The invention will be further explained with reference to the following Examples, but the invention is not meant to be limited to the details described therein.

Examples 1–3

A 150 mm diameter silicon wafer was placed in a LPCVD chamber as described hereinabove and the pressure adjusted to about 25 Torr. The temperature of the wafer was increased to 750° C. when a gas flow of 230 sccm of dichlorosilane, 1000 sccm of ammonia and 9000 sccm of hydrogen carrier gas was started. Deposition was continued for one minute for Examples 1 and 2 and for 6 minutes for Example 3.

Figure 2:
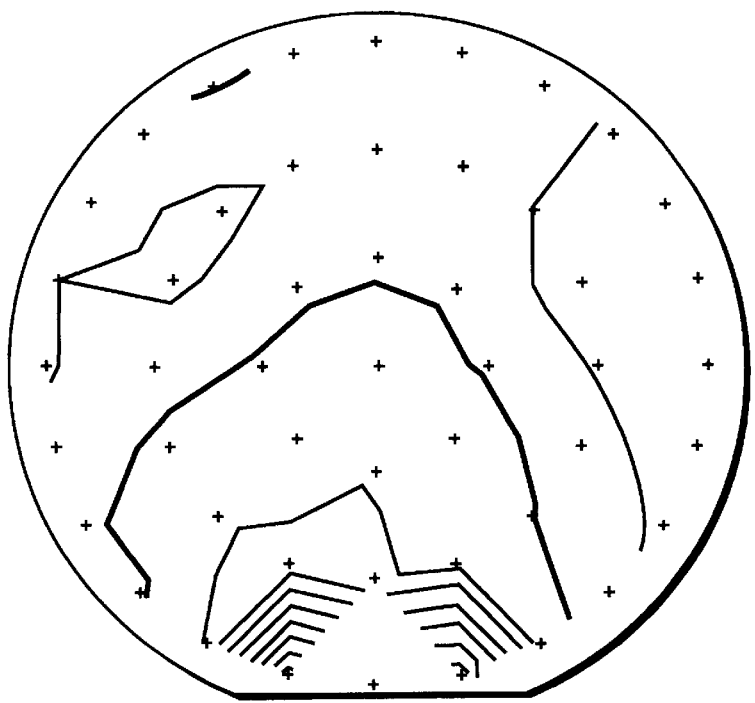
FIGS. 2, 3, and 4 are thickness maps illustrating thickness measurements of films deposited in accordance with the process of the invention.

FIG. 2 is a thickness map of the thin silicon nitride film deposited on the wafer of Example 1. 49 points were measured as indicated in FIG. 2. The average thickness was 173.05+/−3.18 angstroms, indicating excellent uniformity of the film and a deposition rate of about 175 angstroms/minute.

Figure 3:
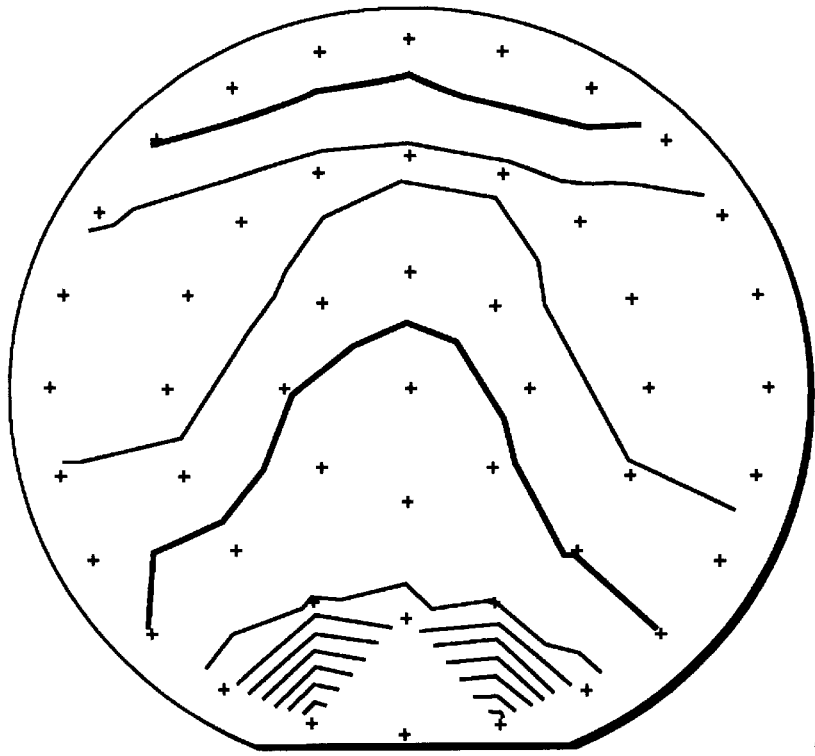

FIG. 3 is a thickness map of the thin silicon nitride film deposited on the wafer of Example 2. Again 49 points were measured as indicated in FIG. 3. The average thickness was 185.52+/−3.57 angstroms, again indicating excellent uniformity of the film. The deposition rate was about 185 angstroms/minute.

Figure 4:
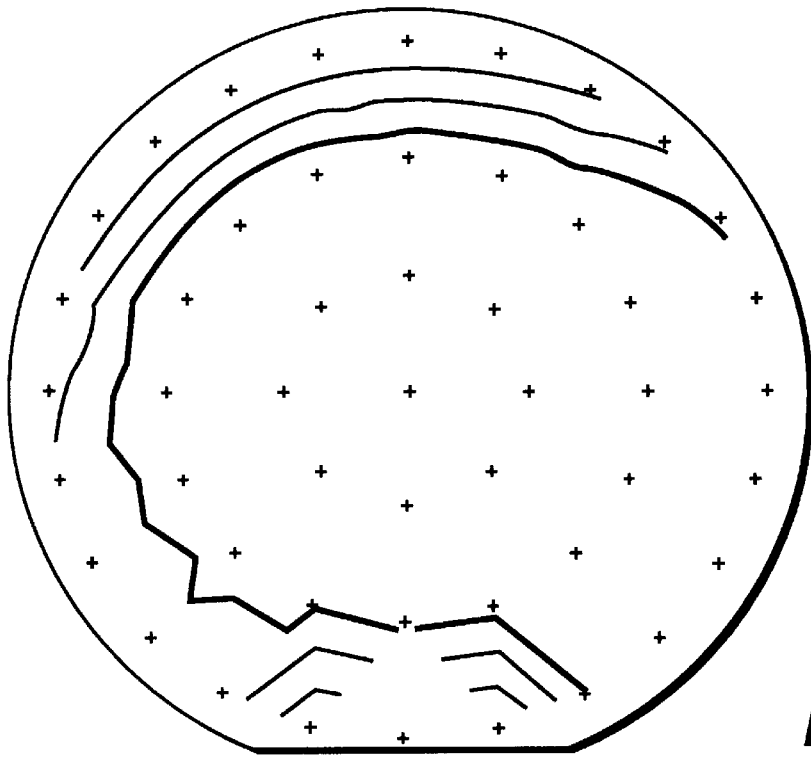

FIG. 4 is a thickness map of the thicker silicon nitride film deposited on the wafer of Example 3. The average thickness was 994.63+/−15.39 angstroms, and excellent uniformity of the film was achieved at a deposition rate of about 165 angstroms/minute.

The refractive index of this film as measured with an ellipsometer was 1.988, indicating that a stoichiometric film was obtained.

The thin silicon nitride films of the invention can be deposited over silicon substrates, over silicon oxide, or sandwiched between silicon oxide layers, in accordance with standard semiconductor device processing. No particular pretreatment of the substrate prior to silicon nitride deposition is required, although native silicon oxide may be desired to be removed prior to deposition of the silicon nitride film directly onto silicon, whether single crystal silicon or polycrystalline silicon. This may be accomplished by a standard preclean etch process, either in the same chamber employed for the silicon nitride deposition, or in another chamber of a multi-chamber vacuum processing system.

The processing parameters can be varied as needed to obtain the desired thickness of the silicon nitride films. The temperature during deposition can be varied from about 650–850° C. For example, the deposition rate can be increased by increasing the temperature of deposition up to about 800° C., which may be desirable if thicker films, on the order of about 300 angstroms in thickness, are to be deposited at practicable rates in a single substrate processing chamber. The pressure can also be varied to affect a change in the deposition rate; in general, the rate of deposition increases as the pressure increases.

The present silicon nitride films can be deposited in a stand-alone LPCVD chamber, or, preferably such chamber can be part of a multi-chamber vacuum processing system. In that case the processing chamber of the invention has a port in a sidewall thereof for transferring substrates into and out of the LPCVD chamber from a central transfer chamber.

Although the present invention has been described in terms of a single substrate processing chamber, variations in equipment and design can be made by one skilled in the art and are meant to be included herein. The invention is only to be limited by the scope of the appended claims.

We claim:

1. A method of depositing films of silicon nitride onto a single substrate in a low pressure chemical vapor deposition chamber comprising
    a) supporting a single substrate in said chamber;
    b) adjusting the pressure to from about 5 to about 100 Torr and heating the substrate to a temperature of from about 650 to about 850° C.; and
    c) passing a precursor gas mixture comprising a silane gas and ammonia into said chamber,
thereby depositing a film of stoichiometric silicon nitride of uniform thickness onto said substrate.

2. A method according to claim 1 wherein said pressure is about 25 Torr.

3. A method according to claim 1 wherein said gas mixture further includes a carrier gas.

4. A method according to claim 3 wherein said carrier gas is selected from the group consisting of hydrogen, nitrogen, argon and helium.

5. A method according to claim 1 wherein said silane is selected from the group consisting of silane, disilane and dichlorosilane.

6. A method according to claim 5 wherein said gas mixture comprises about 230 sccm of dichlorosilane, about 1000 sccm of ammonia and about 9000 sccm of hydrogen.

7. A method according to claim 1 wherein said deposition is continued until a silicon nitride film of at least 100 angstroms in thickness has been deposited.

* * * * *